US006947796B2

(12) United States Patent
Haworth et al.

(10) Patent No.: US 6,947,796 B2
(45) Date of Patent: Sep. 20, 2005

(54) HARDWARE CONFIGURATION AND INTERFACING IN A COMPONENT-BASED ENVIRONMENT FOR A MEDICAL SCANNER

(75) Inventors: Robert H. Haworth, Brookfield, WI (US); Mark T. Radick, Muskego, WI (US); Ajeet Gaddipati, Waukesha, WI (US); Josef P. Debbins, Waukesha, WI (US)

(73) Assignee: General Electric Company, Milwaukee, WI (US)

(*) Notice: Subject to any disclaimer, the term of this patent is extended or adjusted under 35 U.S.C. 154(b) by 0 days.

(21) Appl. No.: 10/249,389

(22) Filed: Apr. 4, 2003

(65) Prior Publication Data

US 2004/0196039 A1 Oct. 7, 2004

(51) Int. Cl.[7] ................... G05B 11/01; G05B 15/00; G01V 3/00
(52) U.S. Cl. .................. 700/17; 700/83; 324/318
(58) Field of Search .............. 700/17, 83; 324/307, 324/309, 318, 322; 600/410, 421; 705/2, 11

(56) References Cited

U.S. PATENT DOCUMENTS

| | | | | |
|---|---|---|---|---|
| 5,157,603 A | * | 10/1992 | Scheller et al. | 606/4 |
| 5,788,851 A | * | 8/1998 | Kenley et al. | 210/739 |
| 6,055,458 A | * | 4/2000 | Cochran et al. | 700/17 |
| 6,157,864 A | * | 12/2000 | Schwenke et al. | 700/79 |
| 6,166,544 A | * | 12/2000 | Debbins et al. | 324/309 |
| 6,304,788 B1 | * | 10/2001 | Eady et al. | 700/86 |
| 6,348,793 B1 | | 2/2002 | Balloni et al. | |
| 6,377,046 B1 | * | 4/2002 | Debbins et al. | 324/309 |
| 6,400,996 B1 | * | 6/2002 | Hoffberg et al. | 700/83 |
| 6,661,228 B2 | * | 12/2003 | Haworth et al. | 324/309 |
| 6,741,672 B2 | * | 5/2004 | Gaddipati et al. | 378/4 |

OTHER PUBLICATIONS

Debbins, J. et al., Novel Software Architecture for Rapid Development of Magnetic Resonance Applications, Sep. 19, 2002, Wiley InterScience, DOl 10.1002/cmr.10039, www.interscience,wiley.com.

* cited by examiner

Primary Examiner—Bru Shrivastav
Assistant Examiner—Dixomara Vargas
(74) Attorney, Agent, or Firm—Ziolkowski Patent Solutions Group, SC; Michael A. Della Penna; Carl B. Horton

(57) ABSTRACT

A system and method for a hardware configuration and interfacing in a component-based environment for a medical imaging system is disclosed. Specifically, the invention directed to software architecture for the control of medical imaging system hardware is disclosed. The architecture can be logically divided into four elements: a system hardware control to provide system hardware availability information and control, a system configuration control to provide hardware constraint information, an application prescription control to identify hardware capabilities requested by a user-selected application and configure hardware settings for the system hardware, and an application hardware control to enable the application to exert control over the system hardware during execution. The architecture allows application software to be independent from hardware control software.

51 Claims, 3 Drawing Sheets

HARDWARE CONFIGURATION AND INTERFACING IN A COMPONENT-BASED ENVIRONMENT FOR A MEDICAL SCANNER

BACKGROUND OF INVENTION

The present invention relates generally to a hardware control system and, more particularly, to a hardware control system for a medical imaging device to allow hardware control software and medical imaging applications to be independent.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

To implement these procedures a complex system of hardware and software is employed. Typically, the software applications used include batch applications and programs written to be processed individually and sequentially. In such a system, the software, both on the application level and the system level, is tailored specifically for a given hardware configuration. As such, a significant modification to the hardware of the system or to a desired application requires a revision of most, if not all, of the software. Furthermore, only the manufacturer is typically capable of this type of revision because only the manufacturer has a sufficient understanding of and access to the software to properly revise the software. This is particularly applicable to medical devices which must comply with federal regulations and standards.

For example, it is often desirable to update a medical imaging system by modifying the programmable pulse sequence. This is typically achieved by editing the source code of the software because the source code allows concise manipulation of variables and the greatest overall flexibility. However, as stated above, it is generally only the manufacturer that has access and is qualified to edit the source code. This can result in a costly and arduous updating process that may result in substantial downtime of the system.

It is generally known that the medical imaging field has been experiencing rapid growth, development and transition. This unprecedented growth adds to the difficulty of developing and improving medical imaging software and hardware to keep pace with the demands of physicians, technicians, and patients. Simply, the advances in technology have led consumers to demand the addition of new developments and improvements to existing medical imaging systems. In order to meet this demand, it is necessary to make such improvements more feasible by lowering the interdependence between medical imaging software and hardware.

The use of object-oriented programming is a step toward separating medical imaging software from hardware. Applications built with object-oriented programming are developed in a block-by-block or "object-by-object" fashion. An "object" is generally considered a programming component that can be used to build arrangements of variables and operations therein. These arrangements can be logically grouped onto "structures" or "classes." Each "class" can be designed to perform a specific operation or operations on data passed to it by another class.

Also, the advent of hardware independent programming languages has enabled the separation of applications from specific operating systems or system software and the hardware controlled by the operating system. Accordingly, medical imaging systems have used the object oriented, hardware independent, programming language Java or similar hardware independent languages for application development. In a medical imaging system these applications reside on an operator console and are selected by a user. By using the Java programming language or a similar hardware independent language, applications may be developed without regard to the operator console hardware or operator console operating system. This division between the operator console and the application is possible using the Java programming language because the Java programming language is compiled into machine independent bytecode class files. Following compilation, the operator console is able to execute the compiled code written in the Java programming language by executing a virtual machine. The virtual machine provides the "bridge" between the machine independent byte code classes and the machine dependent instructions that must be given to cause the operator console to operate according to the application. This division between applications and the operator console operating system allows hardware changes to be made to the operator console with little or no modifications required in the application software. Thus, maximum portability is achieved with respect to application software since the application can operate regardless of the operating system or hardware.

While Java and similar programming languages have provided a means of developing portable applications, such languages cannot be used to develop software for system hardware control because it is necessary to use a programming language capable of direct communication with and control of system hardware. Other object oriented programming languages capable of facilitating real-time control of hardware, such as C++ and others, provide a structured syntax as well as linkers and compliers suitable to implement medical imaging system software for hardware control. However, while this tie between system hardware and system software provides real-time control of hardware, it lacks the ability to make changes to system hardware without requiring corresponding changes to system software.

Therefore, it would be desirable to have a system and method capable of allowing a wide variety of system hardware configurations and applications without requiring system wide or source code updates of the system hardware control software. The system should provide default measures for hardware interaction by an application, allow for new hardware to be added to the system without changing the application and allow a developer to access hardware information for improved maintenance.

BRIEF DESCRIPTION OF INVENTION

The present invention provides a system and method of hardware configuration and interfacing in a component-based environment for a medical imaging system overcoming the aforementioned drawbacks. Specifically, the invention is directed to software architecture for the control of medical imaging system hardware that allows application software and hardware control software to be independent of one another. As such, the invention allows greater hardware and software compatibility by removing interdependence.

In accordance with one aspect of the invention, a medical imaging system is disclosed that has a hardware control including a software architecture allowing hardware system software to be independent from the application software while executing applications written in a hardware independent programming language. The hardware control has an architecture including a logical representation of the system hardware, a prescription block, a configuration block to determine the hardware needed for execution, a run-time control block to manage the hardware during execution of the application, and a set of drivers to control the hardware.

In accordance with another aspect of the invention, a hardware control system is disclosed that includes a system hardware control to provide current system hardware information to a system configuration control for automated configuration of the system hardware. The system configuration control in turn provides constraints of the current system hardware to an application prescription control. The application prescription control identifies hardware usable by the application and configures the application for use of the available system hardware. An application hardware control is disclosed to bind a hardware object held by the system hardware control to allow the application to exert control over the system hardware during execution of the application.

In accordance with another aspect of the invention, an MRI apparatus is disclosed that includes a group of hardware control elements for controlling the MRI apparatus. The apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a group of hardware control elements including a logical representation of system hardware usable by the system, a prescription block and a configuration block to determine the hardware needed by the application, a run-time control block to manage the hardware during execution of the application, and a set of drivers to control the hardware based on commands received from the run-time control block.

In accordance with another aspect of the invention a computer program stored on a computer readable storage medium and having instructions is disclosed. The program, when executed by a computer, causes at least one processor to autodetect current medical imaging system hardware and synchronize a representation of the medical imaging system hardware autodetected by a system hardware control with a system configuration control. The program then causes the at least one processor to retrieve appropriate hardware objects from a repository of hardware objects according to capabilities required by the autodetected hardware. The program then causes, upon operator request, the at least one processor to start an application, optimize hardware settings according to attributes of the hardware objects selected, download hardware components to an application hardware control, bind a selected application to the hardware objects, and run the application.

In accordance with another aspect of the invention a method of hardware control is disclosed. The method includes autodetecting the current medical imaging system hardware and synchronizing a representation of the medical imaging system hardware autodetected by a system hardware control with a system configuration control. The method further includes retrieving appropriate hardware objects from a repository of hardware objects according to the autodetected hardware, optimizing hardware settings according to attributes of the hardware objects selected, downloading hardware components to an application hardware control, binding a selected application to the hardware objects, and running the application.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
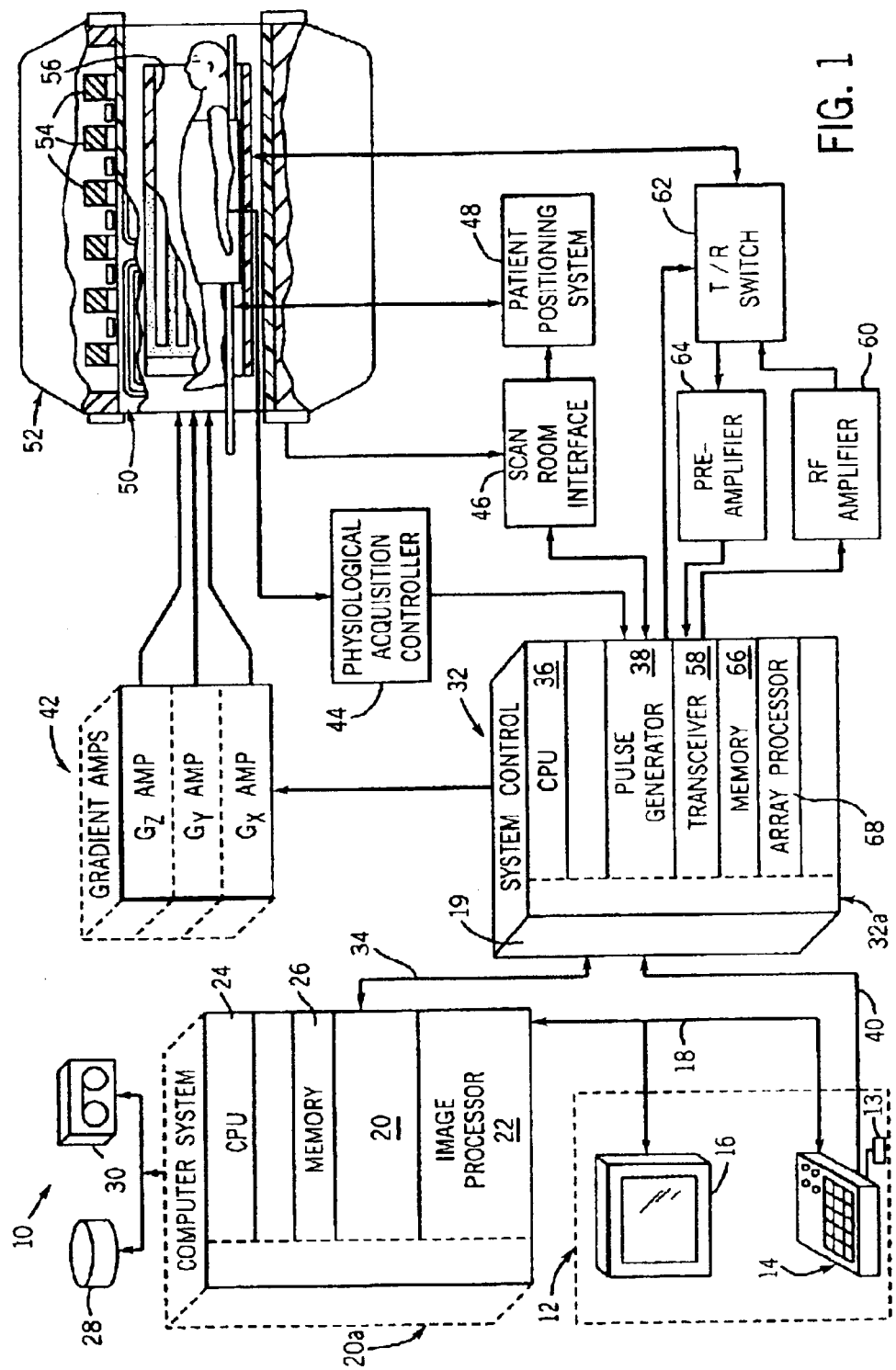
FIG. 1 is a schematic block diagram of an MR imaging system for use with the present invention.

Referring to FIG. 1, the major components of a preferred medical imaging system, in this instance a magnetic resonance imaging (MRI) system 10, incorporating the present invention are shown. The operation of the system is controlled from an operator console 12 which includes a keyboard or other input device 13, a control panel 14, and a display screen 16. The console 12 communicates through a link 18 with a computer system 20. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a system control 32 by way of a high speed serial link 34. The input device 13 can include a mouse, joystick, keyboard, track ball, touch activated screen, light wand, voice control, or any similar or equivalent input device, and may be used for interactive geometry prescription.

As will be described fully with reference to FIGS. 2 and 3, the system control 32 and computer system 20 utilize an architecture that enables the hardware control software and application software to be independent. Furthermore, the application software is written in a hardware independent programming language. The architecture is created by using object oriented programming and multiple classes that are individually independent. As such, it is possible to call or download only the objects that are necessary for the desired application. Accordingly, it is possible to create a hardware control architecture where hardware control software and application software are independent of one another. As a result, software that allows a wide variety of hardware configurations and easily supports new applications and new hardware while minimizing maintenance and troubleshooting may be developed.

The system control 32 includes a set of modules connected together by a backplane 32a. These include a CPU module 36, hardware control units such as a pulse generator module 38 and a transceiver 58. It is through link 34 that the system control 32 communicates with operator console 12 and computer system 20 to facilitate hardware performance as directed by an application selected from user console 12. When a scan sequence is indicated, i.e., the application is run, the computer system 20 and system control 32 facilitate the user-selected application's control of the system hardware. The pulse generator module 38 then operates the system components to carry out the scan sequence in accordance with the application's direction and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. If required by the system control 32, the pulse generator module 38 can also receive patient data from a physiological acquisition controller 44 that receives signals from a number of different sensors connected to the patient, such as ECG signals from electrodes attached to the patient. Additionally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to a desired scan position.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly 50 generally designated to produce the magnetic field gradients used for spatially encoding acquired signals. The gradient coil assembly 50 forms part of a magnet assembly 52 which includes a polarizing magnet 54 and a whole-body RF coil 56. The transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit mode or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12 and controlled by the hardware control this image data may be archived in long-term storage, such as on the tape drive 30, or it may be further processed by the image processor 22 and conveyed to the operator console 12 and presented on the display 16.

Figure 2:
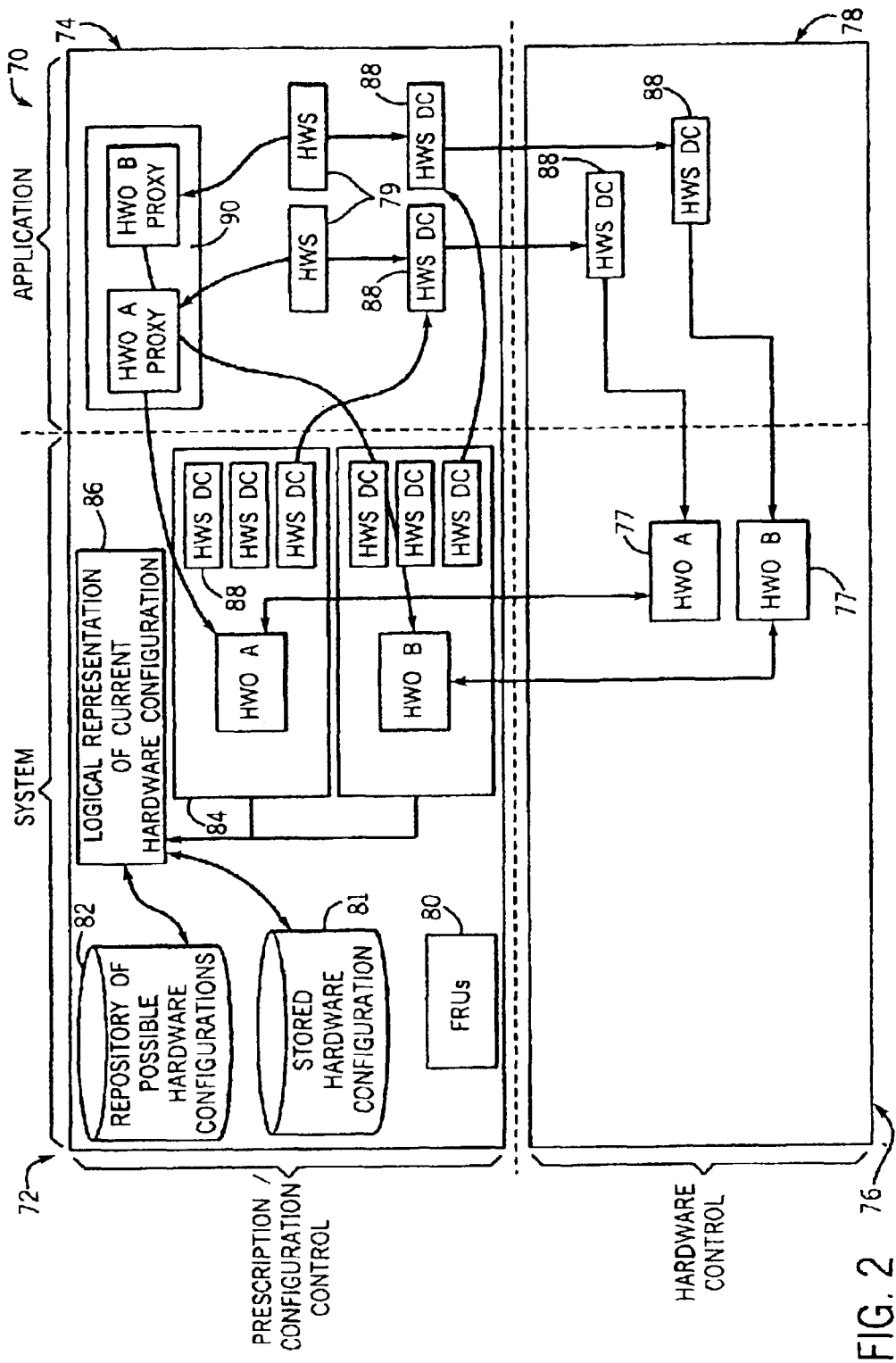
FIG. 2 is a graphic representation of an architectural organization of the hardware control.

Referring now to FIG. 2, a graphic representation of an architectural organization 70 of the system control 32 and computer system software is shown. The architecture 70 is represented by four distinguishable elements: a system configuration control 72, an application prescription control 74, a system hardware control 76, and an application hardware control 78. The elements allow for new hardware to be added to the system without requiring extensive changes to applications. In one embodiment the system configuration control 72 and application prescription control 74 may be part of the computer system 20. The system hardware control 76 and application hardware control 78 may be part of the system control 32.

Upon system startup, i.e. resetting of the system to begin a new scanning session, the system hardware control 76 performs an autodetection/autoconfiguration to detect and prepare for the current hardware configuration of the medical imaging device. As will be described in greater detail below, the system hardware control 76 includes instances of hardware objects (HWO) 77 that are representative of the physical system hardware. The instances of HWO 77 act as drivers to enable the application hardware control 78 to control the hardware in real-time based on commands downloaded from an application prescription control 74. The autodetection enables a logical representation of the current hardware configuration 86 to be maintained by the system configuration control 72. Furthermore, the patient's position or status within the medical imaging system may be autodetected (via hardware and software) along with or separately from the current hardware configuration. Additionally, the real-time status of current system hardware can be made accessible to the system configuration control 72 in order to maintain an accurate and current logical representation of current hardware configuration 86. To assist in autodetection/autoconfiguration of hardware once the system has been updated, a list of field replaceable units (FRUs) 80 and their relationships with other FRUs and non-FRUs is maintained.

A status of current hardware information and patient information derived from the autodetect/autoconfiguration performed by the system hardware control 76 is maintained in synchronization with the system configuration control 72 in order to provide a representation of system hardware capabilities and limitations to a user-selected application. Accordingly, the system configuration control 72, while maintaining a logical representation of current hardware configuration 86, also includes a repository of possible hardware configurations 82 that are supported by the medical imaging system software. Using the repository of possible hardware configurations 82, a configuration of HWO 84 pertaining to the current configuration of the medical imaging device are maintained in the logical representation of current hardware configuration 86. This configuration of HWO 84 is maintained through the merging of autodetection/autoconfiguration information presented by the system hardware control 76, manual configuration information compiled at the time of installation of the medical imaging system or reconfiguration thereafter, and hardware information previously stored in the stored hardware configuration 81. Once merged, the configuration of HWO 84 and the logical representation of current hardware configuration 86 is stored as the stored hardware configuration 81 for fast retrieval of the information upon the next system start up. The storage may be on a hard disk, magnetic tape or other non-volatile storage medium. By storing information previously compiled from manual configuration or other non-autoconfiguration methods, this stored information allows the identification of system hardware or system hardware parameters that were not autoconfigured following start up. The HWO 84 is used to provide any hardware constraints to an application, thus affecting the allowable prescription settings and functional behavior of the components that comprise the application prescription control 74.

A group of hardware downloadable components (HWS DC) 88 associated with the configuration of HWO 84 is maintained by each HWO 84 based on the logical representation of current hardware configuration 86. In a preferred embodiment the HWS DC 88 will have interfaces, preferably written in the Java programming language, that reference the appropriate HWO 84. A HWS DC 88 allows the application prescription control 74 to configure the use of the hardware to the specific control needs of the application prescription control 74 selected by the user.

Once these measures are taken, the hardware control architecture 70 is prepared for an application. The application prescription control 74 has HWS components 79, or building blocks, that define hardware capabilities needed to execute the application but do not specify the actual hardware. In a preferred embodiment, a component will be a JavaBean® JavaBean® is a registered trademark of Sun Microsystems, Inc. of Mountain View, Calif. The HWS 79 contained in an application prescription control 74, make a request in terms of hardware capabilities, using the preferred embodiment using an interface, with the specific goal of retrieving one or more HWS DC's 88. The HWS DCs 88, which are hardware specific, allow an application to make use of a HWS DC 88 without having prior knowledge of the system hardware or the HWS DC's 88 hardware specific properties. The HWS 79 uses the interface of the HWS DC 88 to affect the HWS DC 88 such that the HWS DC 88 will exert the application's desired control over the system hardware control 76 when the application is downloaded and run.

Furthermore, default HWS DCs 88 may be injected into the application prescription control 74 automatically, if necessary, to allow for hardware compatibility with future hardware additions not known or available when the application was written. Should no appropriate HWS DCs 88 for a HWO 84 be present in an application, a HWS DC 88 may be automatically inserted into the application prescription control 74. If more than one HWO 84 is compatible with an application then a user selection of hardware is required. Therefore, by organizing this software for hardware control along the hardware boundaries, software modules can be easily added to the repository of possible hardware configurations 82 when new hardware is added to the system.

Following identification of the application, the application prescription control 74 uses the required hardware capabilities presented by the HWS 79 to map the application's capability requests to specific HWO 84. This mapping is stored in the application's proxy 90 to refer to the actual HWOs 84 used. In other words, the HWO proxies 90 contain the actual selection and a reference to the actual hardware once a selection is made. The application prescription control's 74 HWS 79 will retrieve the necessary hardware control components, HWS DC 88, from the system configuration control 72 anytime the hardware selection or configuration is changed. The retrieved HWS DC 88 is contained in the application prescription control and eventually downloaded to the application hardware control 78. As a result, the application may be effectively configured for the system hardware by selecting the HWS DC 88 appropriate for the capabilities requested by the application. Therefore, the HWS DCs 88 enable the application to make use of the medical imaging system without prior knowledge of hardware component properties. Furthermore, multiple applications can communicate with the system configuration control 72 and appropriate HWS DC 88 can be selected for each application in preparation for the application gaining control of the system hardware.

After the HWS DCs 88, as part of application prescription control 74, are downloaded to the application hardware control 78, each HWS DC 88 instance is bound to their designated HWO 77 held by the system hardware control 76 to enable the controlling and monitoring of the medical imaging system hardware in accordance with the application being executed. This enables the application hardware control 78 and the system hardware control to engage in real-time communication to control the medical imaging system hardware during run-time according to the direction of the selected application. As such, real-time, run-time control of the software necessary to control the medical imaging system hardware is achieved while maintaining hardware and software independence.

Also, while multiple application prescription controls 74 may exist with their corresponding application hardware controls 78, the currently running application hardware control 78 may permit or restrict HWO DCs 88 of non-running applications from accessing the HWO instances 77 held by the system hardware control 76. By restricting the non-running applications from accessing the HWO instances 77 held by the system hardware control 76, components requested by non-running applications can be downloaded and potentially bound while only allowing the running application's HWS DC 88 to exert control over the medical imaging system hardware.

Figure 3:
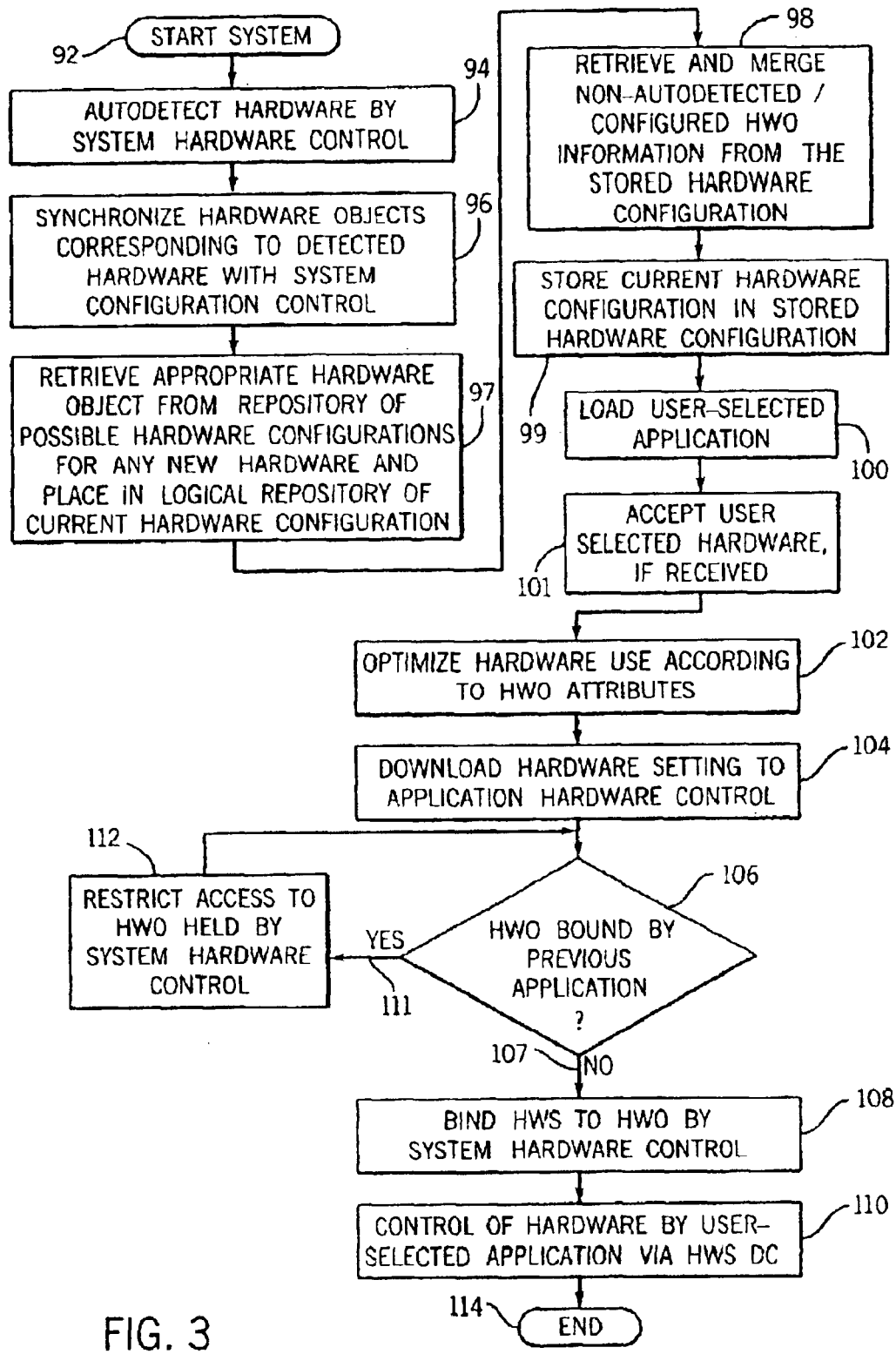
FIG. 3 is a flow chart setting forth the steps of a process to prescribe hardware objects and run an application in accordance with the present invention.

Referring now to FIG. 3, a flow chart setting forth the steps a hardware control technique or process implementable with the architecture described above is shown. The technique begins by starting or restarting 92 the medical imaging system. Following startup 92, the system hardware control 76 autodetects 94 the hardware available in the present configuration of the medical imaging system. Once the available hardware is identified by the autodetection 94, hardware objects (HWO) 84 that correspond to the hardware configuration are synchronized 96 with the system configuration control 72. The system configuration control 72 maintains a repository of possible hardware configurations 82 from which it retrieves 97 HWOs 84 corresponding to the autodetected 94 hardware for the current system. Non-autoconfigured HWO information from the stored hardware configuration 81 is retrieved and merged 98 with the autodetected hardware to form the logical representation of current hardware configuration 86. The current hardware configuration is then stored 99 in the stored hardware configuration 81 in order to preserve the configuration across system restarts. Thereafter, the system is ready to accept an application. Upon user selection of an application to be carried out by the medical imaging system, the system will load the user-selected program or application 100. If necessary, a user selected hardware is accepted 101. The application prescription control 74 optimizes 102 the hardware use according to the capabilities required by the application, the operator prescription, and the constraints of the HWO 84 provided by the system configuration control 72. The application prescription control 74 then downloads 104 the necessary hardware components derived from the system configuration control 72 to the application hardware control 78. The application hardware control 78 then checks 106 the state of the medical imaging system hardware. If it is determined that the hardware is available, then access is granted 107 and the HWSs 88 in the application hardware control 78 are bound 108 to the HWO instances 77 held by the system hardware control 76 permitting the application to exert real-time control 110 over the medical imaging system hardware. However, if it determined that the medical imaging system hardware is already controlled by another application 111, then the application hardware control 78 restricts 112 access to the hardware until the hardware is released by the previous application and access can be granted 107. The application is then executed 114 by the medical imaging system and carried out to acquire data for MR image reconstruction.

It is contemplated that the above architecture can be embodied in a computer program, stored on a computer readable storage medium. The program, when executed by one or more processors of a computer system and/or server, causes the computer system and server to implement the above process.

The present invention has been described in terms of the preferred embodiment, and it is recognized that equivalents, alternatives, and modifications, aside from those expressly stated, are possible and within the scope of the appending claims.

What is claimed is:

1. A medical imaging system to execute applications written in a hardware independent programming language, the medical imaging system having:
    a system control with system control software independent from the applications and designed to communicate with the applications to facilitate application control of the medical imaging system, the system control having an architecture comprising:
    a logical representation of hardware usable by the system;
    a prescription block and a configuration block to determine the hardware needed for execution of the application;
    a run-time control block to manage the hardware during execution of the application; and
    a set of drivers to control the hardware based on commands received from the run-time control block.

2. The medical imaging system of claim 1 wherein the logical representation of hardware includes a repository of hardware objects supported by the system.

3. The medical imaging system of claim 2 wherein the logical representation of hardware includes a configuration of the hardware objects for the system.

4. The medical imaging system of claim 3 wherein the configuration is maintained by an assimilation of autoconfiguration information from the hardware, manual configuration information from an installer, and retrieval of hardware property information from the repository for newly configured hardware.

5. The medical imaging system of claim 4 wherein the configuration is stored on a readable disk for faster retrieval during system start-up and to readily identify non-autoconfigured hardware parameters.

6. The medical imaging system of claim 1 wherein the logical representation of hardware includes a real-time status of current hardware accessible by the prescription block.

7. The medical imaging system of claim 1 wherein the logical representation of hardware includes hardware compatibility.

8. The medical imaging system of claim 1 further comprising an application independent selector mechanism to select hardware to be used during execution of the application.

9. The medical imaging system of claim 1 wherein the logical representation of hardware includes a list of field replaceable hardware and a relationship between field replaced hardware and remaining hardware.

10. The medical imaging system of claim 1 wherein the logical representation of hardware includes a group of downloadable components that are hardware specific and allow the application to make use of the medical imaging system without prior knowledge of component properties.

11. A hardware control system comprising:
    a system hardware control to provide medical imaging system hardware availability information for detailed control of the medical imaging system hardware;
    a system configuration control to receive the system hardware availability information and provide constraint information of the medical imaging system hardware;
    an application prescription control to receive the constraint information of the medical imaging system hardware, identify hardware capabilities requested by the application and configure the application for the medical imaging system hardware; and
    an application hardware control to bind a hardware object to allow the application to exert control over the hardware during execution of the application.

12. The hardware control system of claim 11 wherein the system configuration control maintains a configuration of hardware objects corresponding to the medical imaging system hardware availability.

13. The hardware control system of claim 11 wherein the system hardware control monitors a current configuration of the medical imaging system hardware and a patient status in synchronization with the system configuration control.

14. The hardware control system of claim 11 wherein the system configuration control provides constraint management and information indicating medical imaging system hardware compatibility.

15. The hardware control system of claim 11 wherein the system configuration control provides an application independent selection mechanism when more than one instance of a type of medical imaging system hardware is available.

16. The hardware control system of claim 11 wherein the system configuration control maintains a group of available downloadable components that are hardware specific.

17. The hardware control system of claim 16 wherein the system configuration control provides default downloadable components when required for proper operation of the medical imaging system hardware.

18. The hardware control system of claim 16 wherein the application prescription control uses the constraints of the medical imaging system and the capabilities requested by the application to determine how to configure the application for the medical imaging system hardware.

19. The hardware control system of claim 18 wherein the application is further configured by the application prescription control by selecting downloadable components suited to the capabilities requested by the application.

20. The hardware control system of claim 19 wherein the application prescription control downloads the selected downloadable components to the application hardware control.

21. The hardware control system of claim 20 wherein the application hardware control utilizes the selected downloadable components to bind the hardware object.

22. The hardware control system of claim 11 wherein multiple applications can communicate with the system hardware control and be configured for the medical imaging system hardware.

23. The hardware control system of claim 11 wherein the system hardware control is further configured to restrict access to the hardware object based on the state of a previous application.

24. The hardware control system of claim 23 wherein the application state is one of downloaded, bound, or run.

25. The hardware control system of claim 11 wherein the application hardware control and system hardware control are capable of real-time communication to control the medical imaging system hardware during run-time.

26. The hardware control system of claim 11 wherein the system hardware control is capable of real-time control of the medical imaging system hardware.

27. The hardware control system of claim 11 wherein the system hardware control is capable of autodetection of the medical imaging system hardware.

28. The hardware control system of claim 11 wherein the system hardware control is capable of autodetection of a patient status.

29. The hardware control system of claim 11 wherein the hardware objects bound to the hardware are controlled by components downloaded from the application prescription control.

30. The hardware control system of claim 11 wherein the hardware control system allows hardware control software and medical imaging applications to be independent.

31. An MRI apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil Assembly to acquire MR images; and
a group of hardware control elements for controlling the MRI apparatus, the group comprising:
a logical representation of hardware usable by the system;
a prescription block and configuration block to interface with an application to determine the hardware needed for execution of the application;
a run-time control block to manage the hardware during execution of the application;
a set of drivers to control the hardware based on commands received from the run-time control block.

32. The MRI apparatus of claim 31 wherein the set of drivers enables real-time control of the MRI apparatus.

33. The MRI apparatus of claim 31 wherein the run-time control block maintains a configuration of hardware objects corresponding to the MRI apparatus.

34. The MRI apparatus of claim 33 wherein the run-time control block monitors a current configuration of the MRI apparatus in synchronization with the prescription block to provide prescription information to allow the prescription block to prescribe hardware for the application.

35. The MRI apparatus of claim 31 wherein the prescription block maintains a repository of hardware objects supported by the MRI apparatus.

36. The MRI apparatus of claim 35 wherein the group of hardware control elements is further configured to organize software related to the MRI apparatus along hardware boundaries to allow software modules to be added to the repository of hardware objects when new hardware is added to the MRI apparatus.

37. The MRI apparatus of claim 31 wherein the group of hardware control elements allows hardware control software to be independent from MRI application software.

38. The MRI apparatus of claim 37 wherein the MRI application software can be configured based on the hardware of the MRI apparatus.

39. A computer readable storage medium having stored thereon a computer program comprising instructions which, when executed by at least one process, cause the at least one processor to:
autodetect current medical imaging system hardware;
synchronize a representation of the medical imaging system hardware autodetected by a system hardware control with a system configuration control;
retrieve appropriate hardware objects usable by the current medical imaging system hardware from a repository of hardware objects;
optimize medical imaging system hardware settings according to attributes of the hardware objects selected;
download hardware components to an application hardware control;
bind the selected application to the hardware objects; and
run the application.

40. The computer program of claim 39 wherein the at least one processor is further caused to retrieve appropriate hardware objects for multiple applications.

41. The computer program of claim 40 wherein the at least one processor is further caused to only allow the running application to exert control over the medical imaging system hardware.

42. The computer program of claim 39 wherein a user selection of hardware is permitted if an appropriate hardware object is not selected and more than one hardware of that type is configured.

43. The computer program of claim 39 wherein the at least one processor is further caused to download a default hardware setting to the application hardware control when required for proper operation of the medical imaging system.

44. The computer program of claim 39 wherein the hardware objects are independent from the application.

45. The computer program of claim 39 wherein the at least one processor is further caused to maintain a list of field replaceable units to ensure that the introduction of a replacement field replacement unit results in a proper autodetection, configuration, and calibration.

46. The computer program of claim 39 wherein the repository of hardware objects and the current medical imaging system hardware arc maintained separately.

47. A method of hardware control comprising:
autodetecting current medical imaging system hardware;
synchronizing a representation of the medical imaging system hardware autodetected by a system hardware control with a system configuration control;
retrieving appropriate hardware objects usable by a selected application from a repository of hardware objects;
optimizing medical imaging system hardware settings according to attributes of the hardware objects selected;
downloading hardware components to an application hardware control;
binding the selected application to the hardware objects; and running the application.

48. The method of claim 47 wherein hardware components for multiple applications may be downloaded.

49. The method of claim 47 further comprising determining whether another application is being run.

50. The method of claim 49 wherein the step of binding is not completed if another application is being run.

51. The method of claim 47 wherein the hardware objects are independent from the application.

* * * * *